(12) United States Patent
Ben Yishay et al.

(10) Patent No.: US 11,437,906 B2
(45) Date of Patent: Sep. 6, 2022

(54) SYSTEM AND METHOD FOR POWER SUPPLY RIPPLE COMPENSATION

(71) Applicant: ELBIT SYSTEMS LAND AND C4I LTD., Netanya (IL)

(72) Inventors: Neta Ben Yishay, Netanya (IL); Avi Lax, Netanya (IL)

(73) Assignee: ELBIT SYSTEMS LAND AND C4I LTD., Netanya (IL)

( * ) Notice: Subject to any disclaimer, the term of this patent is extended or adjusted under 35 U.S.C. 154(b) by 0 days.

(21) Appl. No.: 17/413,575

(22) PCT Filed: Oct. 3, 2019

(86) PCT No.: PCT/IL2019/051083
§ 371 (c)(1),
(2) Date: Jun. 14, 2021

(87) PCT Pub. No.: WO2020/129040
PCT Pub. Date: Jun. 25, 2020

(65) Prior Publication Data
US 2022/0085711 A1 Mar. 17, 2022

(30) Foreign Application Priority Data
Dec. 19, 2018 (IL) .......................................... 263850

(51) Int. Cl.
*H02M 1/14* (2006.01)
*H02M 1/00* (2006.01)
*H02M 3/04* (2006.01)
*H02M 1/15* (2006.01)

(52) U.S. Cl.
CPC ......... *H02M 1/143* (2013.01); *H02M 1/0012* (2021.05); *H02M 1/14* (2013.01); *H02M 3/04* (2013.01); *H02M 1/15* (2013.01)

(58) Field of Classification Search
CPC ...... H02M 1/143; H02M 1/0012; H02M 3/04; H02M 1/15
See application file for complete search history.

(56) References Cited

U.S. PATENT DOCUMENTS 4,872,127 A * 10/1989 Nolan ...................... G06J 1/00
708/3
5,004,965 A * 4/1991 Otokawa ................. H02P 6/10
318/400.06
6,583,610 B2 6/2003 Groom et al.
(Continued)

FOREIGN PATENT DOCUMENTS

CN 108964428 A 12/2018

*Primary Examiner* — Yusef A Ahmed

(57) ABSTRACT

A method for compensating for power supply ripple that is present in a supply voltage that is generated by a switched-mode power supply, the method including: calculating an estimated power supply ripple that is expected to be generated by the switched-mode power supply; generating a digital ripple compensation signal, based on the estimated power supply ripple; combining a digital baseband (BB) signal and the digital ripple compensation signal to generate a digital modified BB signal; converting the digital modified BB signal to an analog radio frequency (RF) signal; and amplifying the analog RF signal, based on the supply voltage, to generate a RF transmission signal.

14 Claims, 2 Drawing Sheets

(56) References Cited

U.S. PATENT DOCUMENTS

| | | | |
|---|---|---|---|
| 6,982,593 B2* | 1/2006 | Robinson | H03F 3/217 330/297 |
| 7,068,984 B2* | 6/2006 | Mathe | H03F 1/3282 455/42 |
| 7,471,155 B1* | 12/2008 | Levesque | H03F 1/30 330/296 |
| 8,446,135 B2 | 5/2013 | Chen et al. | |
| 8,519,788 B2* | 8/2013 | Khlat | H03F 3/24 330/297 |
| 8,598,952 B2* | 12/2013 | Oh | H03F 3/2171 330/297 |
| 8,633,766 B2 | 1/2014 | Khlat et al. | |
| 8,648,579 B2 | 2/2014 | Schoofs | |
| 8,698,469 B1* | 4/2014 | Latham, II | H02M 1/15 323/283 |
| 8,824,978 B2* | 9/2014 | Briffa | H03F 3/195 455/127.1 |
| 9,225,231 B2 | 12/2015 | Gorisse et al. | |
| 9,280,163 B2 | 3/2016 | Kay et al. | |
| 9,294,041 B2* | 3/2016 | Khlat | H02M 3/156 |
| 9,484,797 B2 | 11/2016 | Khlat | |
| 9,577,592 B2* | 2/2017 | Liu | H03F 3/245 |
| 9,614,476 B2* | 4/2017 | Khlat | H03F 3/245 |
| 9,621,113 B2 | 4/2017 | Khlat et al. | |
| 10,270,329 B2* | 4/2019 | Karlsson | H02M 1/00 |
| 10,340,893 B1* | 7/2019 | Ahirwar | H03H 17/0416 |
| 10,516,406 B1* | 12/2019 | Kuttner | H03M 1/0845 |
| 2005/0064830 A1 | 3/2005 | Grigore | |
| 2007/0290747 A1* | 12/2007 | Traylor | H03G 3/3047 330/133 |
| 2007/0291718 A1* | 12/2007 | Chan | H03G 3/004 370/338 |
| 2008/0012637 A1* | 1/2008 | Aridas | H03F 1/0211 330/129 |
| 2008/0197930 A1* | 8/2008 | Esguevillas | H03F 1/30 330/297 |
| 2008/0205095 A1 | 8/2008 | Pinon et al. | |
| 2008/0224769 A1* | 9/2008 | Markowski | H03F 3/217 330/136 |
| 2009/0161793 A1* | 6/2009 | Nentwig | H03F 1/0227 375/297 |
| 2012/0212282 A1* | 8/2012 | Spiegel | H02M 3/1588 327/355 |
| 2013/0106378 A1* | 5/2013 | Khlat | H02M 1/15 323/282 |
| 2014/0002043 A1* | 1/2014 | Li | H02M 3/156 323/282 |
| 2014/0077873 A1* | 3/2014 | Motz | H03F 3/45977 330/9 |
| 2014/0139198 A1* | 5/2014 | Manlove | H02M 1/32 323/282 |
| 2014/0253244 A1* | 9/2014 | Folkmann | H03F 3/21 330/291 |
| 2014/0375286 A1* | 12/2014 | Jiang | H02M 1/14 323/271 |
| 2015/0035510 A1* | 2/2015 | Hoshino | H02M 3/157 323/283 |
| 2015/0035608 A1* | 2/2015 | Miyashita | H03F 1/0233 330/297 |
| 2016/0141952 A1 | 5/2016 | Braun | |
| 2016/0190912 A1* | 6/2016 | Lim | G01R 21/006 363/84 |
| 2017/0264185 A1* | 9/2017 | Karlsson | H02M 3/157 |
| 2020/0274436 A1* | 8/2020 | Kimura | H02M 1/143 |
| 2021/0028691 A1* | 1/2021 | Martinez Perez | H02M 1/15 |
| 2021/0320582 A1* | 10/2021 | Li | H02M 3/157 |
| 2022/0200457 A1* | 6/2022 | Mai | H02M 1/15 |
| 2022/0216783 A1* | 7/2022 | Gao | H02M 7/06 |

\* cited by examiner

SYSTEM AND METHOD FOR POWER SUPPLY RIPPLE COMPENSATION

TECHNICAL FIELD

The invention relates to a system and method for power supply ripple compensation.

BACKGROUND

It is important to reduce the power consumption of a power amplifier that transmits radio frequency (RF) transmission signals having a varying envelope. A known technique in the art for reducing the power consumption is envelope tracking, in which a voltage level of a supply voltage provided to the power amplifier varies in accordance with an envelope of an RF signal. A drawback of this technique is the presence of a noise-producing power supply ripple in the supply voltage, the power supply ripple being generated as a function of a switching frequency of a power supply that generates the supply voltage.

There is thus a need in the art for a new system and method for power supply ripple compensation.

References considered to be relevant as background to the presently disclosed subject matter are listed below. Acknowledgement of the references herein is not to be inferred as meaning that these are in any way relevant to the patentability of the presently disclosed subject matter.

U.S. Pat. No. 9,484,797 (Khlat), published on Nov. 1, 2016, relates generally to radio frequency (RF) switching converters and RF amplification devices that use RF switching converters. In one embodiment, an RF switching converter includes a switching circuit operable to receive a power source voltage, a switching controller configured to switch the switching circuit so that the switching circuit generates a pulsed output voltage from the power source voltage, and an RF filter configured to convert the pulsed output voltage into a supply voltage, wherein the RF filter includes a decoupling capacitor configured to receive the supply voltage. The switching controller is configured to generate a ripple correction current that is injected into the decoupling capacitor such that the decoupling capacitor filters the ripple correction current. The decoupling capacitor outputs the ripple correction current such that the ripple correction current reduces a ripple variation in a supply current level of a supply current resulting from the supply voltage.

U.S. Pat. No. 9,280,163 (Kay et al.), published on Mar. 8, 2016, relates to radio frequency (RF) power converters and methods of operating the same. In one embodiment, an RF power converter includes an RF switching converter, a low-drop out (LDO) regulation circuit, and an RF filter. The RF filter is coupled to receive a pulsed output voltage from the RF switching converter and a supply voltage from the LDO regulation circuit. The RF filter is operable to alternate between a first RF filter topology and a second RF filter topology. In the first RF filter topology, the RF filter is configured to convert the pulsed output voltage from a switching circuit into the supply voltage. The RF filter in the second RF filter topology is configured to filter the supply voltage from the LDO regulation circuit to reduce a ripple variation in a supply voltage level of the supply voltage. As such, the RF filter provides greater versatility.

U.S. Patent Application Publication No. 2008/0205095 (Pinon et al.), published on Aug. 28, 2008, discloses systems and methods for compensating ripple current and improved ripple compensators and switching converters capable of compensating ripple current. In one embodiment, the ripple compensator for a switching converter of the type includes a switching means and filtering means comprises means for injecting a compensating current such that the AC component of the switching current and the compensating current are in opposite phase. In addition, the compensation current is elaborated from a signal at a node between the switching means and the filtering means.

U.S. Pat. No. 8,633,766 (Khlat et al.), published on Jan. 21, 2014, relates to a pseudo-envelope follower power management system including a parallel amplifier and a switch mode power supply converter cooperatively coupled to generate a power supply voltage at a power supply output coupled to a linear RF power amplifier. The parallel amplifier output is in communication with the power amplifier supply output. The parallel amplifier governs operation of the switch mode power supply converter and regulates the power amplifier supply voltage base on a VRAMP signal. The parallel amplifier circuit includes an open loop high frequency compensation assist circuit that generates a high frequency ripple compensation current based on an estimate of the high frequency ripple currents contained in a ripple current of the power inductor. The high frequency ripple compensation current is injected into the parallel amplifier circuit output to cancel out high frequency ripple currents at the power amplifier supply output.

U.S. Pat. No. 9,225,231 (Gorisse et al.), published on Dec. 29, 2015, discloses a direct current (DC)-DC converter, which includes an open loop ripple cancellation circuit, a switching supply, and a parallel amplifier. During a calibration mode, the parallel amplifier provides a parallel amplifier output current to regulate a power supply output voltage based on a calibration setpoint. The switching supply drives the parallel amplifier output current toward zero using a switching control signal, such that during the calibration mode, an estimate of a current gain is based on the switching control signal. Further, during the calibration mode, the open loop ripple cancellation circuit is disabled. During a normal operation mode, the open loop ripple cancellation circuit provides a ripple cancellation current, which is based on the estimate of the current gain.

GENERAL DESCRIPTION

In accordance with a first aspect of the presently disclosed subject matter, there is provided a system for power supply ripple compensation, comprising: a switched-mode power supply configured to generate a supply voltage including a power supply ripple; a digital power supply controller configured to generate a control signal for controlling the power supply; a ripple compensation module configured to: calculate an estimated power supply ripple that is expected to be generated by the power supply; and generate a digital ripple compensation signal, based on the estimated power supply ripple; an adder configured to combine a digital baseband (BB) signal and the digital ripple compensation signal to generate a digital modified BB signal, thereby compensating for the power supply ripple; first conversion circuitry configured to convert the digital modified BB signal to an analog radio frequency (RF) signal; and a power amplifier configured to: receive the supply voltage and the analog RF signal; and amplify the analog RF signal, based on the supply voltage, to generate a RF transmission signal; wherein the digital power supply controller and the ripple compensation module are time-synchronized.

In some cases, the estimated power supply ripple is calculated based on a switching frequency of the power supply.

In some cases, a first amplitude of the digital ripple compensation signal is substantially identical to a second amplitude of the estimated power supply ripple, and a first phase of the digital ripple compensation signal is substantially opposite a second phase of the estimated power supply ripple.

In some cases, the system further comprises: second conversion circuitry configured to convert the RF transmission signal to a digital demodulated BB signal; wherein the ripple compensation module is configured to generate the digital ripple compensation signal by: generating a ripple estimation compensation signal having a first amplitude that is substantially identical to a second amplitude of the estimated power supply ripple and a first phase that is substantially opposite a second phase of the estimated power supply ripple; adding the digital BB signal to the ripple estimation compensation signal to generate an intermediate modified BB signal; and generating the digital ripple compensation signal based on a difference between the intermediate modified BB signal and the digital demodulated BB signal.

In some cases, the digital power supply controller comprises: a digital switching controller configured to generate a switching clock and to calculate a duty cycle value; and a digital pulse width modulator (DPWM) configured to generate at least one DPWM signal having a duty cycle in accordance with the switching clock and the duty cycle value; wherein the control signal is generated in accordance with the at least one DPWM signal.

In some cases, the digital power supply controller further comprises: an envelope signal generation module configured to generate an envelope signal in accordance with an amplitude of the digital BB signal, wherein the duty cycle value is calculated based on a magnitude of the envelope signal.

In some cases, the system further comprises: a second analog-to-digital converter (ADC) configured to convert the supply voltage to a digital voltage feedback signal, the digital voltage feedback signal being indicative of a voltage level of the supply voltage; wherein the duly cycle value is calculated based on a difference between the magnitude of the envelope signal and the digital voltage feedback signal.

In accordance with a second aspect of the presently disclosed subject matter, there is provided a method for compensating for power supply ripple that is present in a supply voltage that is generated by a switched-mode power supply, the method comprising: calculating an estimated power supply ripple that is expected to be generated by the power supply; generating a digital ripple compensation signal, based on the estimated power supply ripple; combining a digital baseband (BB) signal and the digital ripple compensation signal to generate a digital modified BB signal; converting the digital modified BB signal to an analog radio frequency (RF) signal; and amplifying the analog RF signal, based on the supply voltage, to generate a RF transmission signal.

In some cases, the estimated power supply ripple is calculated based on a switching frequency of the power supply.

In some cases, a first amplitude of the digital ripple compensation signal is substantially identical to a second amplitude of the estimated power supply ripple, and a first phase of the digital ripple compensation signal is substantially opposite a second phase of the estimated power supply ripple.

In some cases, the method further comprises: converting the RF transmission signal to a digital demodulated BB signal; wherein the generating of the digital ripple compensation signal comprises: generating a ripple estimation compensation signal having a first amplitude that is substantially identical to a second amplitude of the estimated power supply ripple and a first phase that is substantially opposite a second phase of the estimated power supply ripple; adding the digital BB signal to the ripple estimation compensation signal to generate an intermediate modified BB signal; and generating the digital ripple compensation signal based on a difference between the intermediate modified BB signal and the digital demodulated BB signal.

In some cases, the method further comprises: generating a switching clock; calculating a duty cycle value; generating at least one digital pulse width modulator (DPWM) signal having a duty cycle in accordance with the switching clock and the duty cycle value; and generating a control signal for controlling the power supply in accordance with the at least one DPWM signal.

In some cases, the method further comprises: generating an envelope signal in accordance with an amplitude of the digital BB signal, wherein the duty cycle value is calculated based on a magnitude of the envelope signal.

In some cases, the method further comprises: converting the supply voltage to a digital voltage feedback signal, the digital voltage feedback signal being indicative of a voltage level of the supply voltage; wherein the duty cycle value is calculated based on a difference between the magnitude of the envelope signal and the digital voltage feedback signal.

BRIEF DESCRIPTION OF THE DRAWINGS

In order to understand the presently disclosed subject matter and to see how it may be carried out in practice, the subject matter will now be described, by way of non-limiting examples only, with reference to the accompanying drawings, in which.

DETAILED DESCRIPTION

Figure 1:
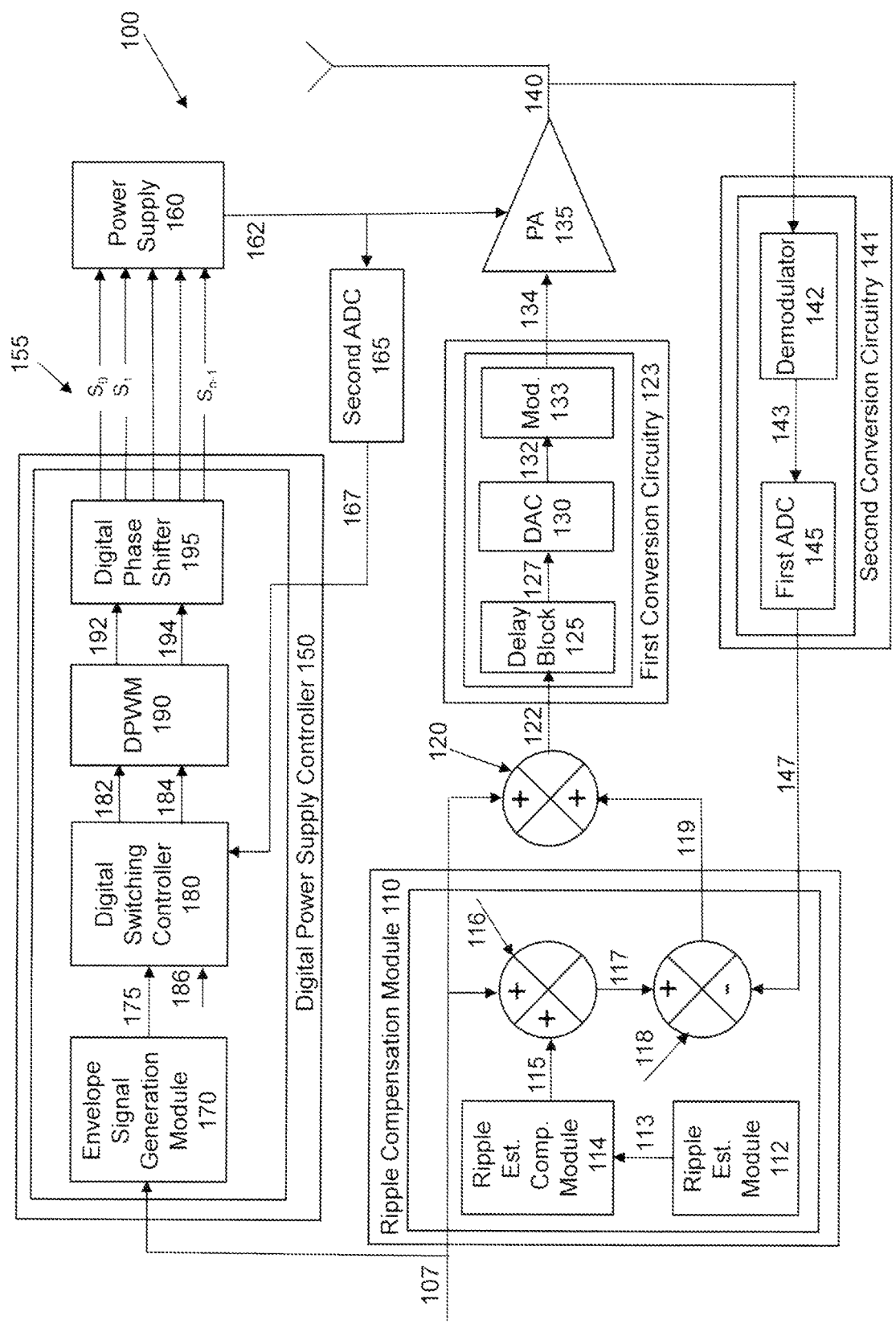
FIG. 1 is a block diagram schematically illustrating an example of a system for power supply ripple compensation, in accordance with the presently disclosed subject matter.

In the following detailed description, numerous specific details are set forth in order to provide a thorough understanding of the presently disclosed subject matter. However, it will be understood by those skilled in the art that the presently disclosed subject matter may be practiced without these specific details. In other instances, well-known methods, procedures, and components have not been described in detail so as not to obscure the presently disclosed subject matter.

In the drawings and descriptions set forth, identical reference numerals indicate those components that are common to different embodiments or configurations.

Unless specifically stated otherwise, as apparent from the following discussions, it is appreciated that throughout the specification discussions utilizing terms such as "generating", "calculating", "combining", "converting", "receiving", "amplifying", "adding", "compensating" or the like, include actions and/or processes, including, inter alia, actions and/or processes of a computer, that manipulate and/or transform data into other data, said data represented as physical quantities, e.g. such as electronic quantities, and/or said data representing the physical objects. The terms "computer", "processor", and "controller" should be expansively construed to cover any kind of electronic device with data processing capabilities, including, by way of non-limiting example, a personal desktop/laptop computer, a server, a computing system, a communication device, a smartphone, a tablet computer, a smart television, a processor (e.g. digital signal processor (DSP), a microcontroller, a field-programmable gate array (FPGA), an application specific integrated circuit (ASIC), etc.), a group of multiple physical machines sharing performance of various tasks, virtual servers co-residing on a single physical machine, any other electronic computing device, and/or any combination thereof.

As used herein, the phrase "for example," "such as", "for instance" and variants thereof describe non-limiting embodiments of the presently disclosed subject matter. Reference in the specification to "one case", "some cases", "other cases" or variants thereof means that a particular feature, structure or characteristic described in connection with the embodiment(s) is included in at least one embodiment of the presently disclosed subject matter. Thus the appearance of the phrase "one case", "some cases", "other cases" or variants thereof does not necessarily refer to the same embodiment(s).

It is appreciated that, unless specifically stated otherwise, certain features of the presently disclosed subject matter, which are, for clarity, described in the context of separate embodiments, may also be provided in combination in a single embodiment. Conversely, various features of the presently disclosed subject matter, which are, for brevity, described in the context of a single embodiment, may also be provided separately or in any suitable sub-combination.

Figure 2:
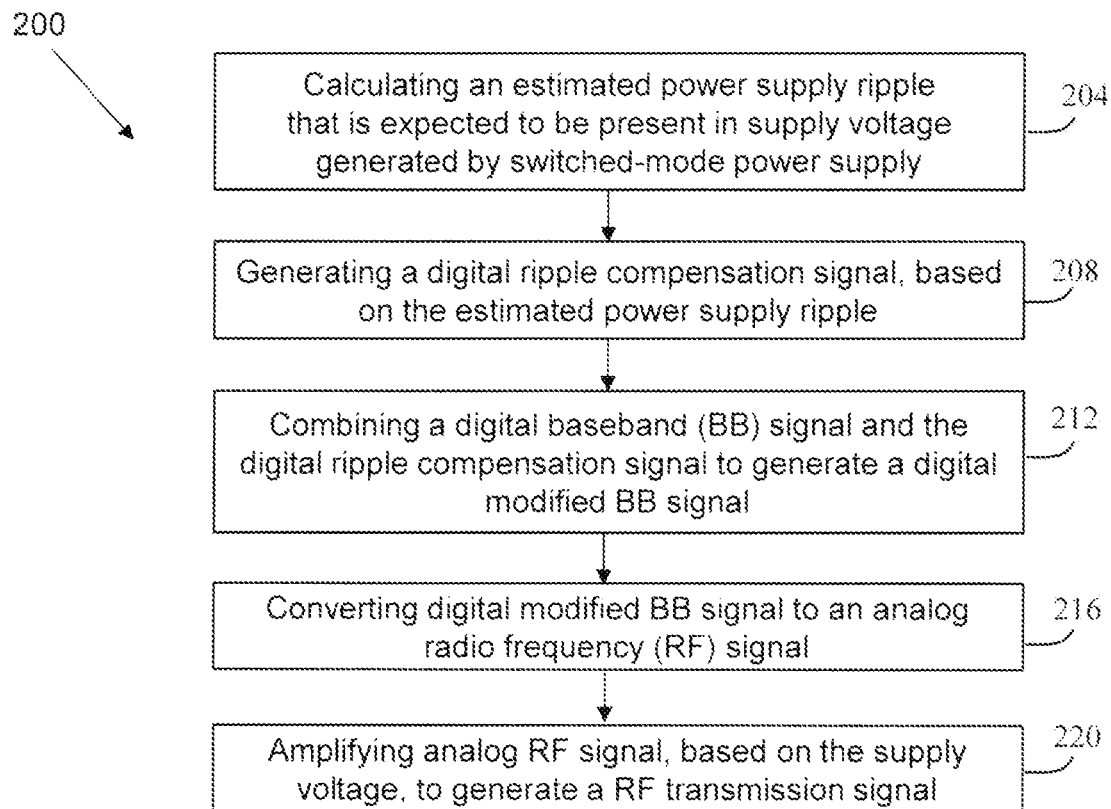
FIG. 2 is a flowchart illustrating one example of a method for power supply ripple compensation, in accordance with the presently disclosed subject matter.

In embodiments of the presently disclosed subject matter, fewer, more and/or different stages than those shown in FIG. 2 may be executed. In embodiments of the presently disclosed subject matter one or more stages illustrated in FIG. 2 may be executed in a different order and/or one or more groups of stages may be executed simultaneously. FIG. 1 illustrates a general schematic of the system architecture in accordance with an embodiment of the presently disclosed subject matter. Each module in FIG. 1 can be made up of any combination of software, hardware and/or firmware that performs the functions as defined and explained herein. The modules in FIG. 1 may be centralized in one location or dispersed over more than one location. In other embodiments of the presently disclosed subject matter, the system may comprise fewer, more, and/or different modules than those shown in FIG. 1.

Any reference in the specification to a method should be applied mutatis mutandis to a system capable of executing the method and should be applied mutatis mutandis to a non-transitory computer readable medium that stores instructions that once executed by a computer result in the execution of the method.

Any reference in the specification to a system should be applied mutatis mutandis to a method that may be executed by the system and should be applied mutatis mutandis to a non-transitory computer readable medium that stores instructions that may be executed by the system.

Any reference in the specification to a non-transitory computer readable medium should be applied mutatis mutandis to a system capable of executing the instructions stored in the non-transitory computer readable medium and should be applied mutatis mutandis to method that may be executed by a computer that reads the instructions stored in the non-transitory computer readable medium.

Bearing this in mind, attention is drawn to FIG. 1, a schematic illustration of an example of a system 100 for power supply ripple compensation, in accordance with the presently disclosed subject matter.

In accordance with the presently disclosed subject matter, system 100 can be configured to include a digital processor (not shown), the digital processor being configured to include ripple compensation module 110, second adder 120, delay block 125, and digital power supply controller 150. In some cases, the digital processor can include one or more integrated circuits. In some cases, the digital processor can include programmable components. In some cases, the digital processor can include a field-programmable gate array (FPGA).

Ripple compensation module 110 can be configured to compensate for power supply ripple that is present on a supply voltage 162 generated by switched-mode power supply 160. The supply voltage 162 is provided to power amplifier (PA) 135 for transmission of one or more radio frequency (RF) transmission signals 140. The power supply ripple is a function of a switching frequency of power supply 160.

Ripple compensation module 110 can be configured to include ripple estimation module 112 and ripple estimation compensation module 114, and optionally, first adder 116 and comparator 118.

Ripple estimation module 112 can be configured to calculate an estimated power supply ripple 113 that is expected to be present on supply voltage 162 generated by power supply 160, based on a switching frequency of power supply 160.

Ripple estimation compensation module 114 can be configured to generate a ripple estimation compensation signal 115 having a first amplitude that is substantially identical to a second amplitude of the estimated power supply ripple 113 and a first phase that is substantially opposite a second phase of the estimated power supply ripple 113. In some cases, ripple estimation compensation signal 115 can be digital ripple compensation signal 119.

Alternatively, in some cases, first adder 116 can be configured to add digital baseband (BB) signal 107 to ripple estimation compensation signal 115 to generate an intermediate modified BB signal 117. First adder 116 can be configured to obtain digital BB signal 107 from a baseband processor (not shown), the digital BB signal 107 being information to be transmitted in a corresponding RF transmission signal 140 along a transmission path.

In addition, comparator 118 can be configured to generate digital ripple compensation signal 119 based on a difference between intermediate modified BB signal 117 and digital demodulated BB signal 147, the digital demodulated BB signal 147 being comprised of digital BB signal 107 as modified by the PA 135 and the power supply ripple present on digital demodulated BB signal 147. In this manner, the power supply ripple is compensated based on estimated power supply ripple 113 and the power supply ripple present on digital demodulated BB signal 147.

Second adder 120 can be configured to combine digital BB signal 107 and digital ripple compensation signal 119 to generate a digital modified BB signal 122, thereby compensating for the power supply ripple that is present on supply voltage 162.

First conversion circuitry 123 can be configured to convert digital modified BB signal 122 to analog RF signal 134.

First conversion circuitry 123 can be configured to include delay block 125, digital-to-analog converter (DAC) 130, and modulator 133.

In some cases, as shown in FIG. 1, delay block 125 can be configured to delay digital modified BB signal 122 to generate delayed digital modified BB signal 127, thereby compensating for delays in power supply 160 and power supply controller 150; digital-to-analog converter (DAC) 130 can be configured to convert delayed digital modified BB signal 127 to analog BB signal 132; and modulator 133 can be configured to modulate analog BB signal 132 to generate analog RF signal 134. In other cases, the digital processor can be configured to include modulator 133, prior to or after the delay block 125.

Power amplifier 135 can be configured to receive supply voltage 162 and analog RF signal 134; and amplify analog RF signal 134, based on supply voltage 162, to generate a RF transmission signal 140, being transmitted via an antenna.

In some cases, RF transmission signal 140 can be fed into second conversion circuitry 141, which is configured to convert RF transmission signal 140 to digital demodulated BB signal 147. Second conversion circuitry 141 can be configured to include a demodulator 142 and a first analog-to-digital converter (ADC) 145.

In some cases, as shown in FIG. 1, demodulator 142 can be configured to demodulate RF transmission signal 140 into a demodulated BB signal 143, and first ADC 145 can be configured to convert demodulated BB signal 143 to digital demodulated BB signal 147. In other cases, the digital processor can be configured to include demodulator 142 (i.e., the analog-to-digital conversion by first ADC 145 can be performed prior to the demodulation by demodulator 142).

Digital power supply controller 150 can be configured to generate a control signal 155 for controlling the power supply 160. In some cases, the control signal 155 can include one or more control bits (for example, control bits $S_0$, $S_1$, . . . $S_{n-1}$). The control signal 155 can be generated to enable the supply voltage 162 to track analog RF signal 134, thereby enabling the PA 135 to operate with greater power efficiency.

In some cases, second ADC 165 can be configured to convert the supply voltage 162 to a digital voltage feedback signal 167, the digital voltage feedback signal 167 being indicative of a voltage level of the supply voltage 162.

In some cases, digital power supply controller 150 can be configured to track an envelope of digital BB signal 107 using envelope tracking. In these cases, power supply controller 150 can be configured to include an envelope signal generation module 170, a digital switching controller 180, a digital pulse width modulator (DPWM) 190 and, optionally, a digital phase shifter 195.

Envelope signal generation module 170 can be configured to obtain digital BB signal 107, and to generate an envelope signal 175 in accordance with an amplitude of digital BB signal 107, in accordance with Equation 1:

$$\text{Envelope Signal} = (I^2 + Q^2)^{1/2} \tag{Equation 1}$$

The signal "I" represents an in-phase component of digital BB signal 107, and the signal "Q" represents a quadrature component of digital BB signal 107.

Digital switching controller 180 can be configured to receive envelope signal 175 and system clock 186, wherein system clock 186 can be generated by one or more clock generators (not shown). Digital switching controller 180 can be configured to generate a switching clock 182 that is synchronized with system clock 186, wherein the switching frequency of power supply 160 is set in accordance with the frequency of switching clock 182. The frequency of switching clock 182 can be set in accordance with Equation 2:

$$\text{Frequency} = (\tfrac{1}{2}^n) * F_s, \tag{Equation 2}$$

wherein n is an integer greater than or equal to 1, and wherein $F_s$ is the frequency of system clock 186.

It is to be noted that all processing activity that occurs on digital processor is performed in accordance with one or more clocks that are synchronized with system clock 186 in order for system 100 to be coherent.

Returning to digital switching controller 180, digital switching controller 180 can be configured to calculate a duty cycle value 184 based on a magnitude of envelope signal 175, the envelope signal 175 being indicative of an expected voltage level of the supply voltage 162. In some cases, as shown in FIG. 1, digital switching controller 180 can be configured to calculate the duty cycle value 184 based on a difference between a magnitude of envelope signal 175 and digital voltage feedback signal 167. The switching clock 182 and the duty cycle value 184 can control switch timing of switches in the power supply 160, as further detailed herein. In some cases, digital switching controller 180 can include a proportional-integral-derivative (PID) controller (not shown).

DPWM 190 can be configured to receive switching clock 182 and duty cycle value 184 from digital switching controller 180. In some cases, DPWM 190 can be configured to generate a high DPWM signal 192 and a low DPWM signal 194, each having a duty cycle in accordance with a frequency of switching clock 182 and duty cycle value 184, wherein the high DPWM signal 192 and the low DPWM signal 194 are phase inverted with respect to each other, thereby performing a guard time for switches of the power supply 160. In some cases, DPWM 190 can be configured to generate a single DPWM signal, and the guard time can be performed by analog means before power supply 160.

Digital phase shifter 195 can be configured to split high DPWM signal 192 and/or low DPWM signal 194 into a control signal 155 having n control bits ($S_0$, . . . , $S_{n-1}$) that are phase-shifted from one another by (360/n) degrees, wherein n is an integer greater than or equal to 2, and to provide the control signal 155 to power supply 160. In some cases, the high DPWM signal 192 and/or low DPWM signal 194 can be provided as a control signal 155 directly to power supply 160.

Power supply 160 can be configured to include a fixed voltage source (not shown), and one or more switches (not shown), wherein each of the switches can be turned on and off in accordance with a corresponding control bit (for example, control bits $S_0$, $S_1$, . . . $S_{n-1}$) of the control signal 155. In some cases, the switches of the power supply 160 can be switchable transistors. The supply voltage 162 output by power supply 160 can be a function of the fixed voltage source and a state (on or off) of each of the switches of power supply 160. In some cases, the voltage level of the fixed voltage source is 50V.

Attention is now drawn to FIG. 2, a flowchart illustrating one example of a method 200 for power supply ripple compensation, in accordance with the presently disclosed subject matter.

The method 200 comprises: calculating an estimated power supply ripple 113 that is expected to be present in supply voltage 162 generated by switched-mode power supply 160, using ripple estimation module 112 (block 204); generating a digital ripple compensation signal 119 based on the estimated power supply ripple 113, as detailed earlier herein, inter alia with reference to FIG. 1 (block 208); combining a digital baseband (BB) signal 107 and the digital ripple compensation signal 119 to generate a digital modified BB signal 122, using second adder 120 (block 212); converting digital modified BB signal 122 to an analog radio frequency (RF) signal 134, using first conversion circuitry 123, as detailed earlier herein, inter alia with reference to FIG. 1 (block 216); and amplifying analog RF signal 134, based on supply voltage 162, to generate RF transmission signal 140, using power amplifier (PA) 135 (block 220).

It is to be noted that, with reference to FIG. 2, some of the blocks can be integrated into a consolidated block or can be broken down to a few blocks and/or other blocks may be added. It is to be further noted that some of the blocks are optional. It should be also noted that whilst the flow diagram is described also with reference to the system elements that realizes them, this is by no means binding, and the blocks can be performed by elements other than those described herein.

It is to be understood that the presently disclosed subject matter is not limited in its application to the details set forth in the description contained herein or illustrated in the drawings. The presently disclosed subject matter is capable of other embodiments and of being practiced and carried out in various ways. Hence, it is to be understood that the phraseology and terminology employed herein are for the purpose of description and should not be regarded as limiting. As such, those skilled in the art will appreciate that the conception upon which this disclosure is based may readily be utilized as a basis for designing other structures, methods, and systems for carrying out the several purposes of the present presently disclosed subject matter.

It will also be understood that the system according to the presently disclosed subject matter can be implemented, at least partly, as a suitably programmed computer. Likewise, the presently disclosed subject matter contemplates a computer program being readable by a computer for executing the disclosed method. The presently disclosed subject matter further contemplates a machine-readable memory tangibly embodying a program of instructions executable by the machine for executing the disclosed method.

The invention claimed is:

1. A system for power supply ripple compensation, comprising:
a switched-mode power supply configured to generate a supply voltage including a power supply ripple;
a digital power supply controller configured to generate a control signal for controlling the switched-mode power supply;
a ripple compensation module configured to:
calculate an estimated power supply ripple that is expected to be generated by the switched-mode power supply; and
generate a digital ripple compensation signal, based on the estimated power supply ripple;
an adder configured to combine a digital baseband (BB) signal and the digital ripple compensation signal to generate a digital modified BB signal, thereby compensating for the power supply ripple;
a first conversion circuitry configured to convert the digital modified BB signal to an analog radio frequency (RF) signal; and
a power amplifier configured to:
receive the supply voltage and the analog RF signal; and
amplify the analog RF signal, based on the supply voltage, to generate a RF transmission signal;
wherein the digital power supply controller and the ripple compensation module are time-synchronized.

2. The system of claim 1, wherein the estimated power supply ripple is calculated based on a switching frequency of the switched-mode power supply.

3. The system of claim 1, wherein a first amplitude of the digital ripple compensation signal is substantially identical to a second amplitude of the estimated power supply ripple, and wherein a first phase of the digital ripple compensation signal is substantially opposite a second phase of the estimated power supply ripple.

4. The system of claim 1, further comprising:
a second conversion circuitry configured to convert the RF transmission signal to a digital demodulated BB signal;
wherein the ripple compensation module is configured to generate the digital ripple compensation signal by:
generating a ripple estimation compensation signal having a first amplitude that is substantially identical to a second amplitude of the estimated power supply ripple and a first phase that is substantially opposite a second phase of the estimated power supply ripple;
adding the digital BB signal to the ripple estimation compensation signal to generate an intermediate modified BB signal; and
generating the digital ripple compensation signal based on a difference between the intermediate modified BB signal and the digital demodulated BB signal.

5. The system of claim 1, wherein the digital power supply controller comprises:
a digital switching controller configured to generate a switching clock and to calculate a duty cycle value; and
a digital pulse width modulator (DPWM) configured to generate at least one DPWM signal having a duty cycle in accordance with the switching clock and the duty cycle value;
wherein the control signal is generated in accordance with the at least one DPWM signal.

6. The system of claim 5, wherein the digital power supply controller further comprises:
an envelope signal generation module configured to generate an envelope signal in accordance with an amplitude of the digital BB signal,
wherein the duty cycle value is calculated based on a magnitude of the envelope signal.

7. The system of claim 6, further comprising:
a second analog-to-digital converter (ADC) configured to convert the supply voltage to a digital voltage feedback signal, the digital voltage feedback signal being indicative of a voltage level of the supply voltage;
wherein the duty cycle value is calculated based on a difference between the magnitude of the envelope signal and the digital voltage feedback signal.

8. A method for compensating for power supply ripple that is present in a supply voltage that is generated by a switched-mode power supply, the method comprising:
calculating, by a ripple compensation module, an estimated power supply ripple that is expected to be generated by the switched-mode power supply;
generating, by the ripple compensation module, a digital ripple compensation signal, based on the estimated power supply ripple;

combining, by an adder, a digital baseband (BB) signal and the digital ripple compensation signal to generate a digital modified BB signal, thereby compensating for the power supply ripple;

converting, by a first conversion circuitry, the digital modified BB signal to an analog radio frequency (RF) signal; and amplifying, by a power amplifier, the analog RF signal, based on the supply voltage, to generate a RF transmission signal, wherein a digital power supply controller is configured to generate a control signal for controlling the switched-mode power supply, and wherein the digital power supply controller and the ripple compensation module are time-synchronized.

9. The method of claim 8, wherein the estimated power supply ripple is calculated based on a switching frequency of the switched-mode power supply.

10. The method of claim 8, wherein a first amplitude of the digital ripple compensation signal is substantially identical to a second amplitude of the estimated power supply ripple, and wherein a first phase of the digital ripple compensation signal is substantially opposite a second phase of the estimated power supply ripple.

11. The method of claim 8, further comprising:
converting, by a second conversion circuitry, the RF transmission signal to a digital demodulated BB signal;
wherein the generating of the digital ripple compensation signal, by the ripple compensation module, comprises:
generating a ripple estimation compensation signal having a first amplitude that is substantially identical to a second amplitude of the estimated power supply ripple and a first phase that is substantially opposite a second phase of the estimated power supply ripple;

adding the digital BB signal to the ripple estimation compensation signal to generate an intermediate modified BB signal; and
generating the digital ripple compensation signal based on a difference between the intermediate modified BB signal and the digital demodulated BB signal.

12. The method of claim 8, further comprising:
generating, by a digital switching controller, a switching clock;
calculating, by the digital switching controller, a duty cycle value;
generating, by a digital pulse width modulator (DPWM), at least one digital pulse width modulator (DPWM) signal having a duty cycle in accordance with the switching clock and the duty cycle value; and
generating, by the digital power supply controller, the control signal for controlling the switched-mode power supply in accordance with the at least one DPWM signal.

13. The method of claim 12, further comprising:
generating, by an envelope signal generation module, an envelope signal in accordance with an amplitude of the digital BB signal,
wherein the duty cycle value is calculated based on a magnitude of the envelope signal.

14. The method of claim 13, further comprising:
converting, by a second analog-to-digital converter (ADC), the supply voltage to a digital voltage feedback signal, the digital voltage feedback signal being indicative of a voltage level of the supply voltage;
wherein the duty cycle value is calculated based on a difference between the magnitude of the envelope signal and the digital voltage feedback signal.

* * * * *